US008113084B2

(12) United States Patent
Yano et al.

(10) Patent No.: US 8,113,084 B2
(45) Date of Patent: Feb. 14, 2012

(54) MOUNTING DEVICE

(75) Inventors: Kazuya Yano, Nirasaki (JP); Hiroshi Shimoyama, Nirasaki (JP); Masaru Suzuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1017 days.

(21) Appl. No.: 12/020,655

(22) Filed: Jan. 28, 2008

(65) Prior Publication Data

US 2008/0184916 A1 Aug. 7, 2008

(30) Foreign Application Priority Data

Feb. 2, 2007 (JP) ................................ 2007-024911

(51) Int. Cl.
*G01R 31/00* (2006.01)

(52) U.S. Cl. ................................ 74/490.08; 324/750.22

(58) Field of Classification Search ............... 74/490.08, 74/566–569; 324/750.16, 750.19, 750.22, 324/754.08

See application file for complete search history.

(56) References Cited

U.S. PATENT DOCUMENTS

| | | | | |
|---|---|---|---|---|
| 5,198,752 | A * | 3/1993 | Miyata et al. | 324/750.08 |
| 5,489,853 | A * | 2/1996 | Nakajima | 324/750.22 |
| 6,140,828 | A * | 10/2000 | Iino et al. | 324/750.22 |
| 6,634,245 | B1 | 10/2003 | Yoshioka et al. | |
| 6,906,542 | B2 * | 6/2005 | Sakagawa et al. | 324/754.07 |

FOREIGN PATENT DOCUMENTS

| | | |
|---|---|---|
| JP | 64-070734 | 3/1989 |
| JP | 4-337621 | 11/1992 |
| JP | 2000-238232 | 9/2000 |
| JP | 2000-286312 | 10/2000 |

OTHER PUBLICATIONS

Office Action issued Jan. 25, 2011, in Japanese Patent Application No. 2007-024911 (with English-language translation).
Office Action issued Sep. 20, 2011 in Japanese Patent Application No. 2007-024911 filed Feb. 2, 2007 (with English translation).

* cited by examiner

*Primary Examiner* — Richard W Ridley
*Assistant Examiner* — Terence Boes
(74) *Attorney, Agent, or Firm* — Oblon, Spivak, McClelland, Maier & Neustadt, L.L.P.

(57) ABSTRACT

A mounting device includes a vertically movable mounting table for mounting thereon a target object and a rotational driving mechanism for rotating the mounting table within a predetermined angle. The mounting table is vertically raised and rotated by the rotational driving mechanism. The rotational driving mechanism includes a driving shaft extending in a tangential direction of the mounting table and a moving body moving in the tangential direction via the driving shaft. A first cam follower is attached in perpendicular to the moving body and a second cam follower is extending horizontally from an outer circumferential surface of the mounting table so as to be in contact with the first cam follower. Also, a resilient member connecting the mounting table and the moving body brings the first cam follower and the second cam follower into elastic contact with each other.

11 Claims, 5 Drawing Sheets

10

MOUNTING DEVICE

FIELD OF THE INVENTION

The present invention relates to a mounting device having a mounting table for mounting thereon a target object; and, more particularly, to a mounting device having a simplified rotational driving mechanism for rotating a mounting table within a predetermined angle.

BACKGROUND OF THE INVENTION

FIG. 4 shows an exemplary inspection apparatus having a conventional mounting device. Such an inspection apparatus includes: a mounting device 1, provided in an inspection chamber, for lifting up and down a target object W (e.g., a semiconductor wafer); an XY stage for moving the mounting device 1 in X and Y directions; a probe card 3 disposed above the XY stage 2; and an alignment mechanism 4 for performing alignment between a plurality of probes 3A of the probe card 3 and the semiconductor wafer W on the mounting device 1. The inspection apparatus tests electrical characteristics of the semiconductor wafer W by making electrical contacts between the probes 3A and the semiconductor wafer W which have been aligned. The alignment mechanism 4 further has a lower camera 4A attached to the mounting device 1 and an upper camera 4B capable of moving to a position directly under the probe card 3.

As shown in, e.g., FIGS. 5A and 5B, the mounting device 1 has a mounting table 1A for mounting thereon the semiconductor wafer W, an elevation driving mechanism (not shown) for lifting up and down the mounting table 1A, and a rotational driving mechanism 1B (hereinafter, referred to as "θ direction driving mechanism") for rotating the mounting table 1A within a predetermined angle in a circumferential direction (hereinafter, referred to as "θ direction"). The elevation driving mechanism vertically moves the mounting table 1A when the semiconductor wafer W needs to be delivered or inspected. The θ direction driving mechanism 1B rotates the mounting table 1A, which can be temporarily raised pneumatically, in the θ direction within a predetermined angle, thus performing the alignment between the semiconductor wafer W and the probes 3A.

The θ direction driving mechanism 1B will be described in more detail with reference to FIGS. 5A and 5B. As can be seen from FIGS. 5A and 5B, the θ direction driving mechanism 1B has a motor 1C provided near the mounting table 1A; a ball screw 1D extending from the motor 1C in a tangential direction of the mounting table 1A; a moving body 1E movably attached to the ball screw 1D; a protrusion 1F horizontally protruded from a circumferential surface of the mounting table 1A; a link 1G for connecting the moving body 1E and the protrusion 1F; and a linear guide mechanism 1H, provided under the moving body 1E, for linearly guiding the moving body 1E. One end portion of the link 1G is axially supported with respect to a shaft of the moving body 1E via, e.g., a bearing, and the other end of the link 1G is axially supported with respect to a shaft of the protrusion 1F via a linear bush. The shaft of the protrusion 1F may be a spline shaft. Moreover, a reference numeral 1I indicates an encoder.

If the θ direction driving mechanism 1B is driven during the alignment between the semiconductor wafer W and the probes 3A, the moving body 1E moves linearly along the ball screw 1D. The linear movement of the moving body 1E is converted to a rotational movement of the mounting table 1A via the link 1G while raising the mounting table 1A via the linear bush. When the alignment between the semiconductor wafer W and the probes 3 is completed by rotating the mounting table 1A in a predetermined angle, the motor 1C stops, and the mounting table 1A is lowered along the linear bush (or the spline shaft) from the position where the mounting table 1A was raised and stops. Techniques for pneumatically raising the mounting table 1A are disclosed in Patent Documents 1 and 2.

Patent Document 1: Japanese Patent Laid-open Application No. H07-307368

Patent Document 2: Japanese Patent Laid-open Application No. H11-288985

However, as shown in FIGS. 5A and 5B, the conventional θ direction driving mechanism 1B is constructed by a link mechanism for converting the linear movement of the moving body 1D to the rotational movement of the mounting table 1A. Thus, the link mechanism needs to be designed precisely, and efforts are required for installation of the link mechanism, thereby increasing costs therefor. Further, a high-priced linear bush (or spline shaft) is used as the elevation mechanism of the mounting table 1A, so that the costs increase further.

SUMMARY OF THE INVENTION

In view of the above, the present invention provides a cost effective mounting device by simplifying a θ direction driving mechanism (a rotational driving mechanism of a mounting table).

In accordance with an embodiment of the present invention, there is provided a mounting device including: a vertically movable mounting table for mounting thereon a target object; and a rotational driving mechanism for rotating the mounting table within a predetermined angle. The mounting table is vertically raised and rotated by the rotational driving mechanism.

Further, the rotational driving mechanism includes: a driving shaft extending in a tangent direction of the mounting table; a moving body moving in the tangent direction via the driving shaft; a first cam follower attached in perpendicular to the moving body; a second cam follower extending horizontally from an outer circumferential surface of the mounting table so as to be in contact with the first cam follower; and a resilient member for connecting the mounting table and the moving body so as to bring the first cam follower and the second cam follower into elastic contact with each other.

Further, the rotational driving mechanism may have a rotation driving unit for rotating the driving shaft.

Moreover, the rotational driving mechanism may have a linear guide mechanism for moving and guiding the moving body in the tangent direction.

The resilient member may be a spring.

In accordance with the embodiment of the present invention, it is possible to provide a cost effective mounting device by employing a simplified rotational driving mechanism of a mounting table.

BRIEF DESCRIPTION OF THE DRAWINGS

The objects and features of the present invention will become apparent from the following description of embodiments, given in conjunction with the accompanying drawings, in which.

DETAILED DESCRIPTION OF THE EMBODIMENT

The embodiment of the present invention will be described with reference to FIGS. 1 to 3 which form a part hereof.

As shown in, e.g., FIGS. 1 and 2, the mounting device 10 of this embodiment includes a vertically movable mounting table 11 for mounting thereon a target object (e.g., a semiconductor wafer, not shown) and a rotational driving mechanism (hereinafter, referred to as "θ direction driving mechanism") 12 for rotating the mounting table 11 within a predetermined angle in a circumferential direction (hereinafter, referred to as "θ direction"). The mounting device 10 of this embodiment is constructed based on the conventional mounting device, except for the θ direction driving mechanism 12. Hence, hereinafter, the description will focus on the θ direction driving mechanism 12.

Figure 1:
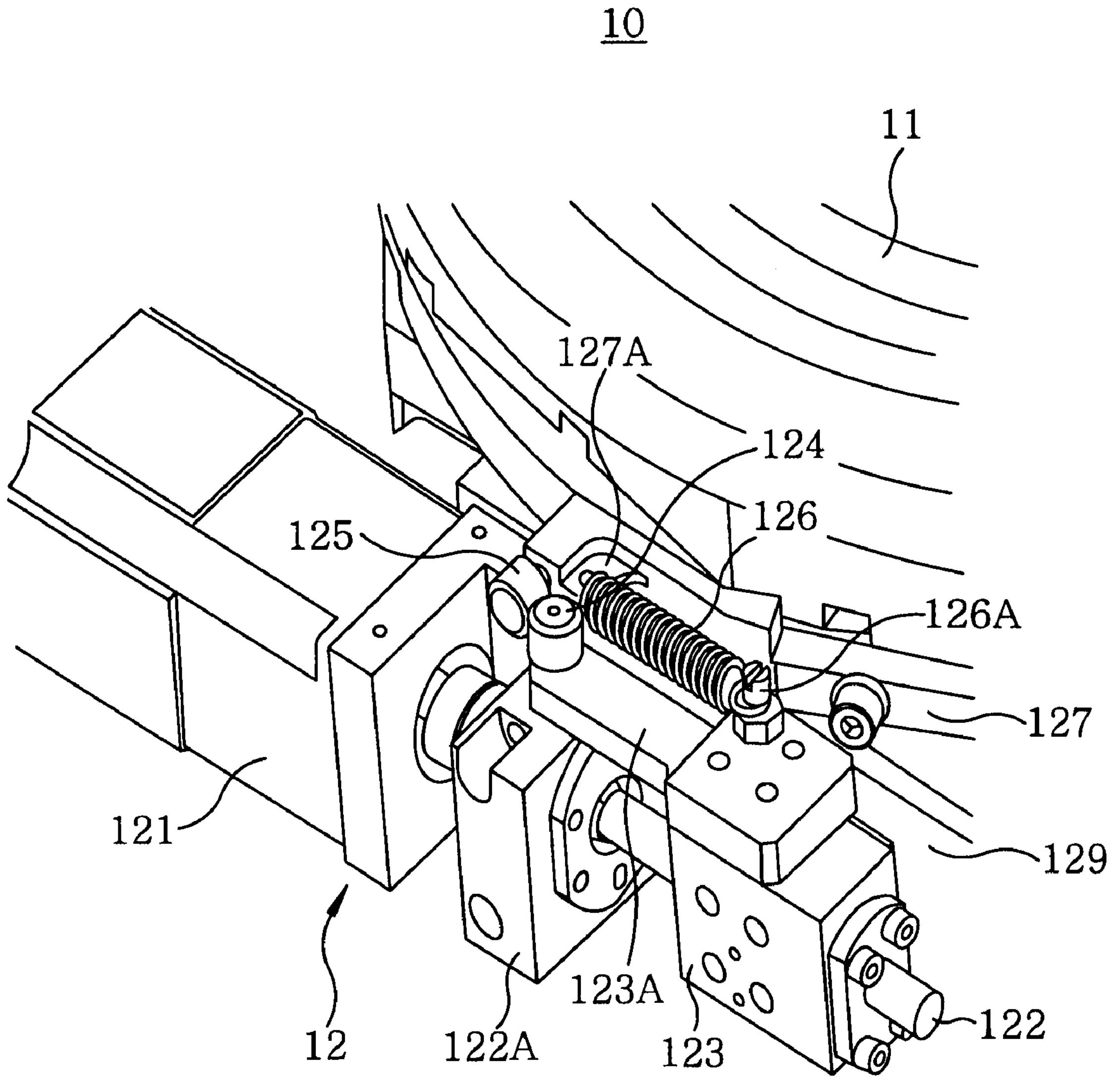
FIG. 1 is a perspective view showing principal parts of a mounting device in accordance with an embodiment of the present invention.
Figure 2:
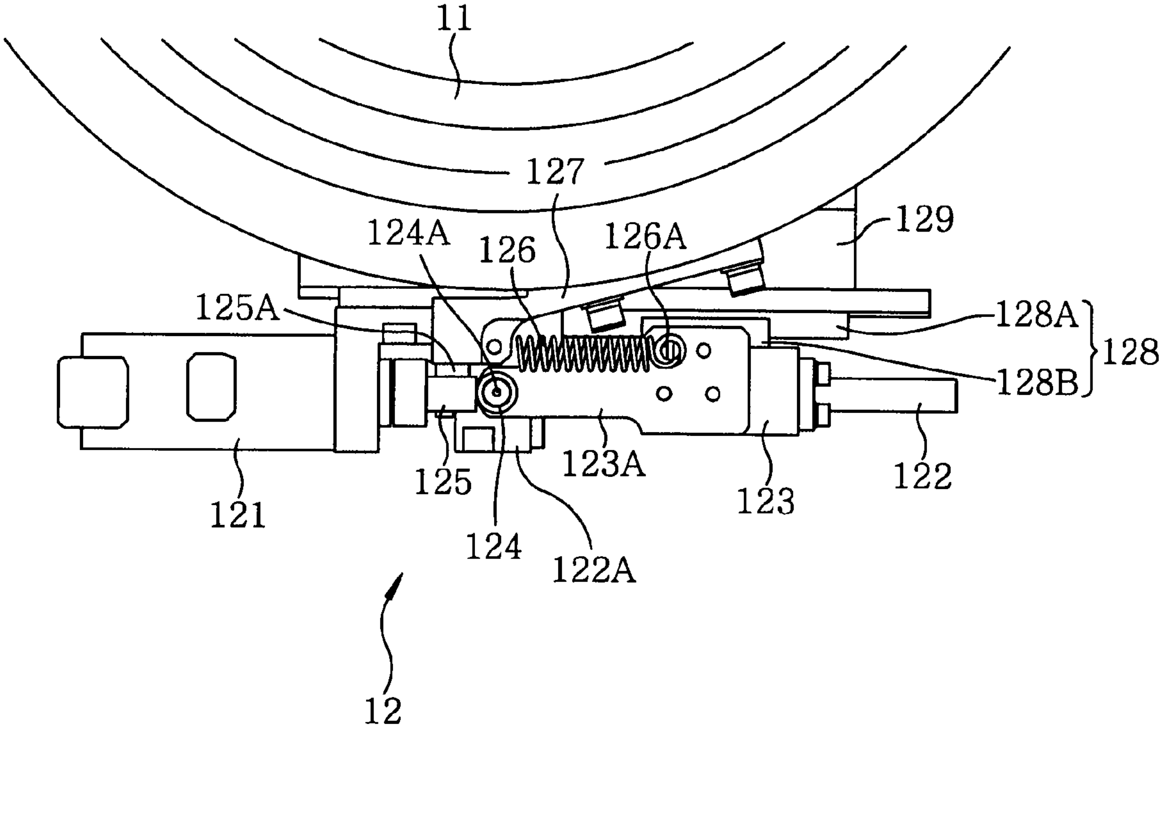
FIG. 2 provides a top view of the mounting device of FIG. 1.

As illustrated in FIGS. 1 and 2, the θ direction driving mechanism 12 includes: a rotation driving unit (e.g., a motor 121) having an encoder and provided near the mounting table 11; a driving shaft (e.g., a ball screw 122), whose one end is connected with the motor 121, extending in a tangential direction of the mounting table 11; a moving body 123 moving in the tangential direction of the mounting table 11 via the ball screw 122; a first cam follower 124, attached in perpendicular to a top surface of the moving body 123, rotating about a first shaft 124A (see FIG. 2); a second cam follower 125 in contact with the first cam follower 124 and rotating about a second shaft 125A extending horizontally from an outer circumferential surface of the mounting table 11 (see FIG. 2); and a resilient member (e.g., a coil spring 126) for connecting the mounting table 11 and the moving body 123 so that the first cam follower 124 and the second cam follower 125 are brought into elastic contact with each other.

As can be seen from FIG. 1, one end portion of the ball screw 122 is rotatably axially supported by a bearing 122A. The moving body 123 is screw-coupled with the ball screw 122. The moving body 123 is constructed to move along the ball screw 122 by the rotation of the motor 121 under the control of the encoder.

Moreover, as illustrated in FIGS. 1 and 2, the moving body 123 includes a supporting member 123A extending from an upper part of the moving body 123 toward the motor 121. The first shaft 124A is disposed at an extended end portion of the supporting member 123A, and the first cam follower is rotatably attached to the first shaft 124A. Further, a first attaching member 127 is fixed to the outer circumferential surface of the mounting table 11 along the circumferential direction thereof. The second shaft 125A extending horizontally from the outer circumferential surface of the mounting table 11 is fixed to the first attaching member 127, and the second cam follower 125 is rotatably attached to the second shaft 125A.

A horizontal bracket 127A is formed at the first attaching member 127 near the second cam follower 125, and one end of the coil spring 126 is connected to a hole of the bracket 127A. Moreover, a third shaft 126A is provided at a base end of the supporting member 123A, and the other end of the coil spring 126 is connected to the third shaft 126A. The first cam follower 124 and the second cam follower 125 are brought into elastic contact with each other by the coil spring 126.

Figure 3:
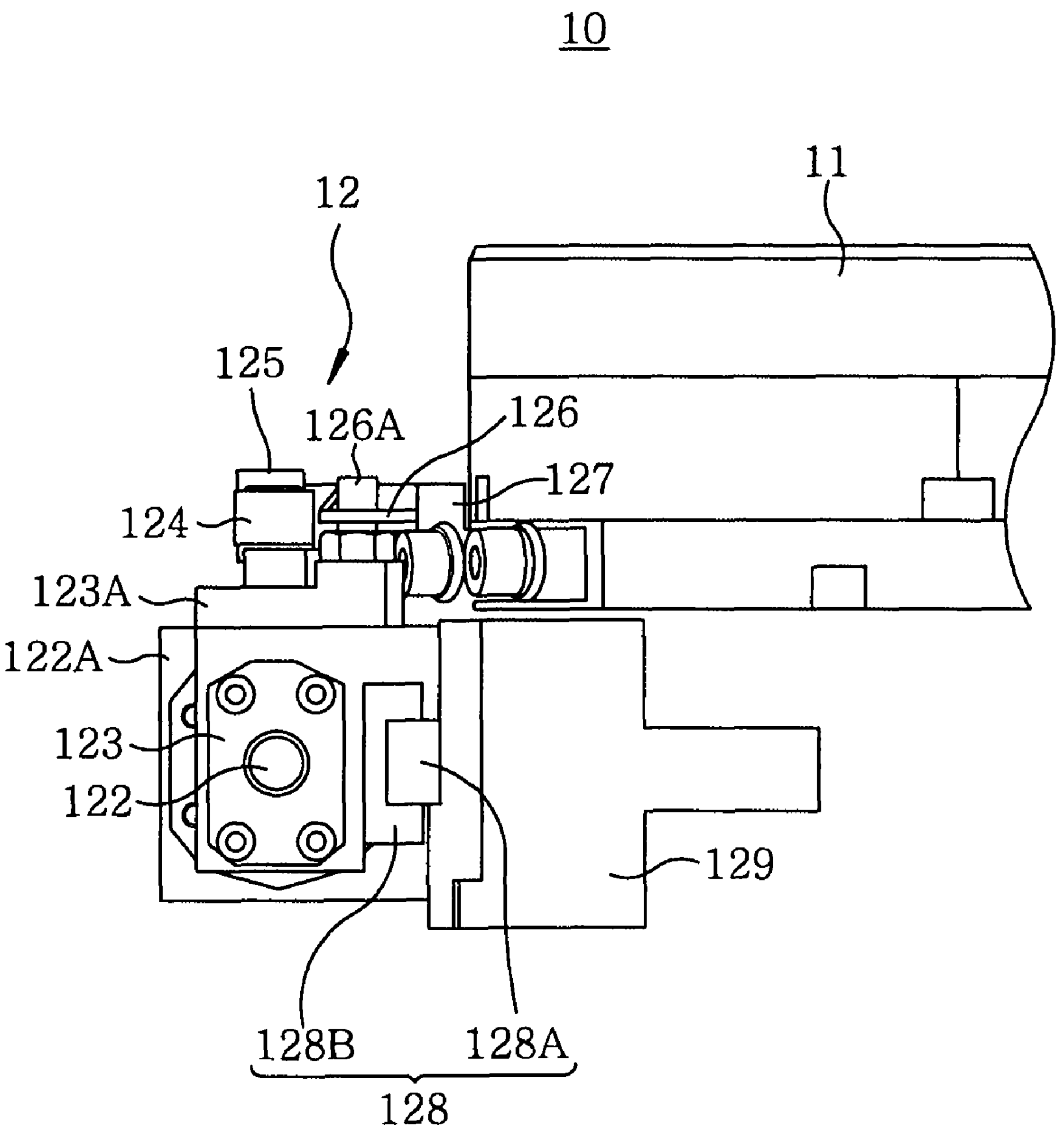
FIG. 3 presents a front view of the mounting device of FIG. 1.
Figure 4:
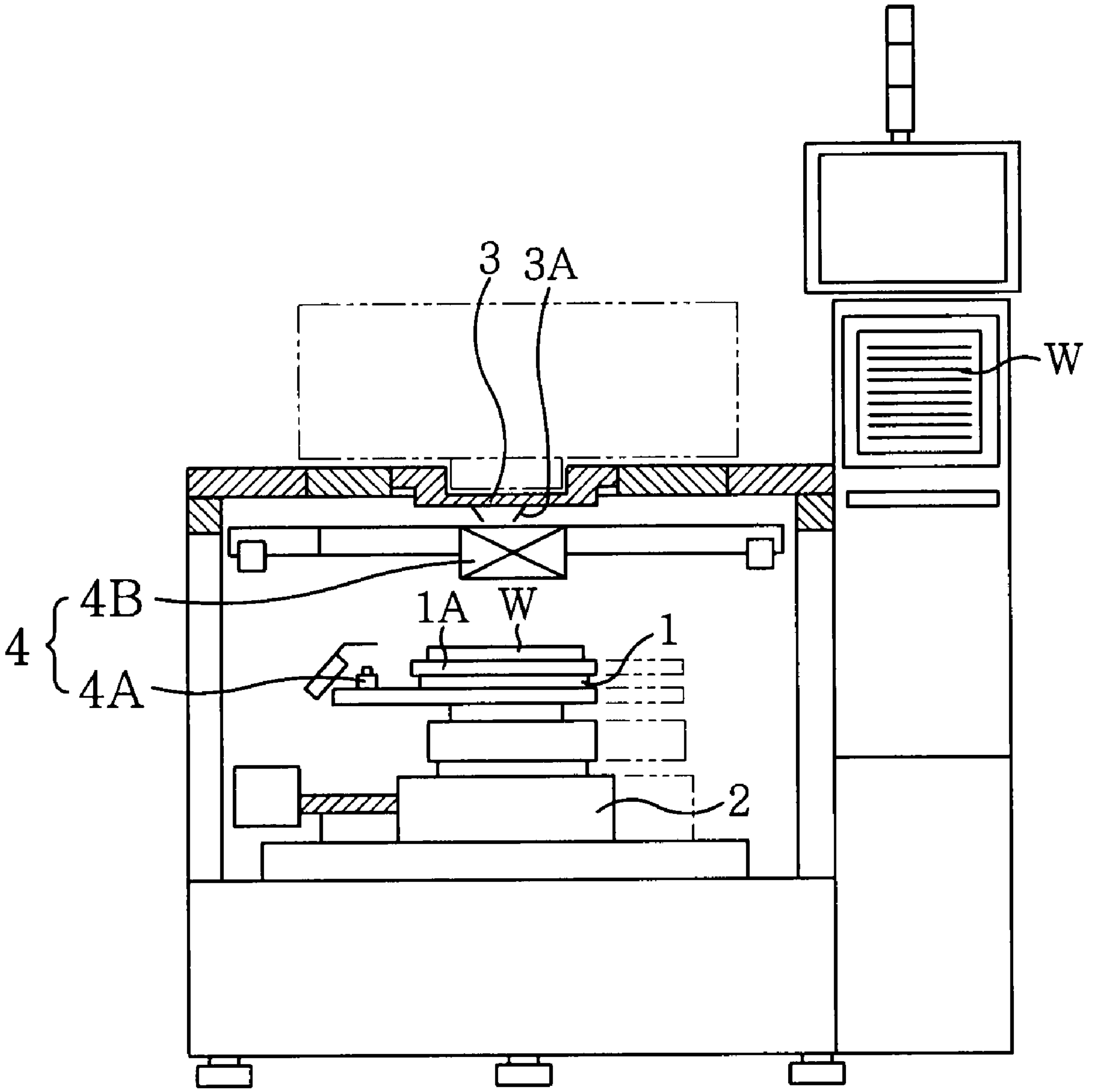
FIG. 4 (PRIOR ART)
FIG. 4 represents a front view illustrating an interior of an inspection apparatus in which a conventional mounting device is employed.
Figure 5A:
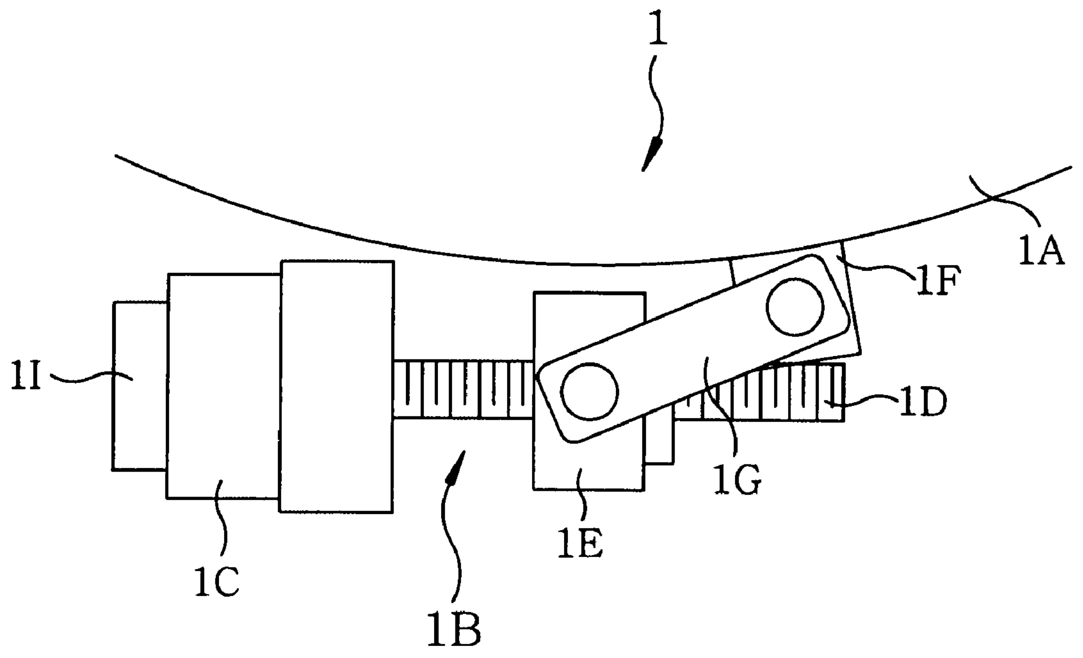
FIG.5A (PRIOR ART)
FIGS. 5A and 5B depict principal parts of the mounting device of FIG. 4, wherein FIG. 5A offers a top view thereof and FIG. 5B provides a side view thereof.
Figure 5B:
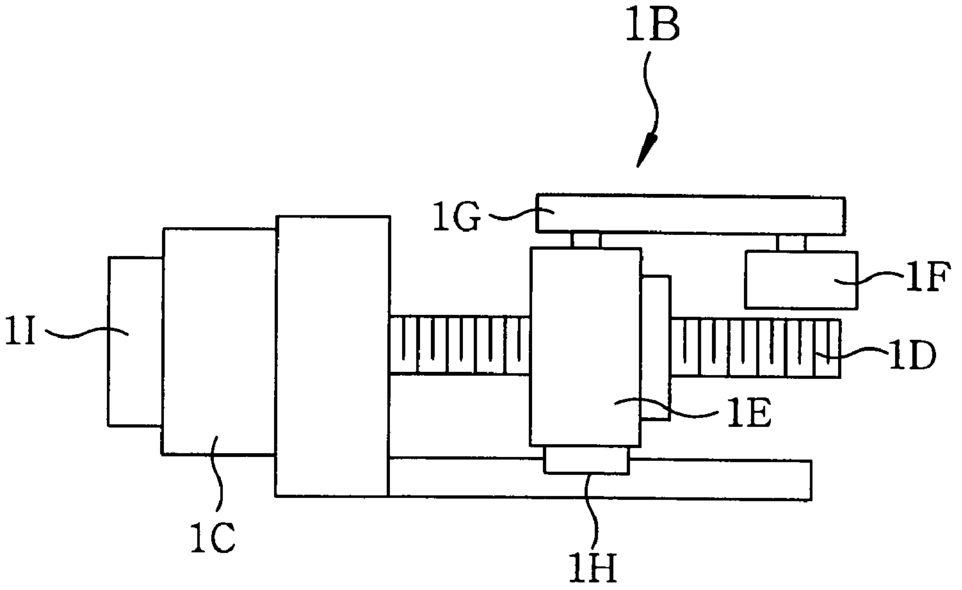
FIG.5B (PRIOR ART)

In addition, the moving body 123 is constructed to move linearly along the ball screw 122 by the linear guide mechanism 128, as described in FIGS. 2 and 3. The linear guide mechanism 128 has a linear guide 128A disposed at a position slightly lower than the mounting table 11 and an engagement body 128B engaged with the linear guide 128A. A second attaching member 129 is fixedly disposed below a bottom surface of the mounting table 11, and the linear guide 128A is attached to the second attaching member 129 in parallel with the ball screw 122. The engagement body 128B is fixed to a side surface of the moving body 123.

Accordingly, when the ball screw 122 rotates by the motor 121 and thus the moving body 123 moves linearly along the ball screw 122 by the linear guide mechanism 128, the mounting table 11 rotates in a state where the first and second cam followers 124 and 125 are in elastic contact with each other by the coil spring 126. At this time, the mounting table 11 is pneumatically raised in a vertical direction. Since, however, the first and second cam followers 124 and 125 in this embodiment are in elastic contact with each other, the second cam follower 125 is guided by the first cam follower 124 so that the mounting table 11 can be raised in the vertical direction.

Hereinafter, an operation will be described. When a semiconductor wafer is mounted on the mounting table 11 and is aligned with a plurality of probes of a probe card, the mounting device 10 is moved in X and Y directions via a XY stage. After completing an alignment of the X and Y directions by an alignment mechanism, the θ direction driving mechanism 12 is driven so that the ball screw 122 is rotated by the motor 121. Accordingly, the moving body 123 moves linearly along the ball screw 122 by the linear guide mechanism 128 and, simultaneously, the mounting table 11 rotates in a state where the first and second cam followers 124 and 125 are in elastic contact with each other via the coil spring 126. At this time, the second cam follower 125 is slightly raised along the first cam follower 124, so that the mounting table 11 is raised vertically.

When the alignment between the probes and the semiconductor wafer is completed by raising and rotating the mounting table 11 in a predetermined angle, the motor 121 stops. Then, while the second cam follower 125 is elastically contacting with the first cam follower 124, the second cam follower 125 is lowered from the position where the mounting table 11 was raised, so that the mounting table 11 is vertically lowered and stops. Therefore, in the present embodiment, the linear movement of the moving body 123 can be converted into the rotational movement of the mounting table 11 by the coil spring 126. Further, the mounting table 11 can be lifted up and down via the first and the second cam followers 124 and 125.

As set forth above, in accordance with the mounting device 10 of the present embodiment, the θ direction driving mechanism 12 includes: the motor 121; the ball screw 122 extending from the motor 121 in the tangential direction of the mounting table 11; the moving body 123 moving in the tangential direction by the ball screw 122; the first cam follower 124 attached in perpendicular to the moving body 123; the second cam follower 125 extending horizontally from the outer circumferential surface of the mounting table 11 so as to be in contact with the first cam follower 124; and the coil spring 126 connecting the mounting table 11 and the moving body 123 so that the first and the second cam followers 124 and 125 can be in elastic contact with each other. As described, the coil spring 126 of low cost and simple structure is utilized instead of the conventional link mechanism to convert the linear movement of the moving body 123 into the rotational movement of the mounting table 11. Moreover, the less costly first and second cam followers 124 and 125 are used to lift the mounting table 11 up and down. Accordingly, in the present embodiment, the θ direction driving mechanism 12 can be constructed at a low cost by simplifying the structure thereof.

Further, in accordance with the present embodiment, the θ direction driving mechanism 12 has the linear guide mechanism 128 for moving and guiding the moving body 123 in the tangential direction of the mounting table 11, thereby enabling to precisely move the moving body 123 linearly along the ball screw 122.

The present invention is not limited to the above embodiment, and the design thereof can be appropriately changed when necessary. In the above embodiment, the coil spring is used as a resilient member for bringing the first and the second cam follower into elastic contact with each other. However, a spring of a different type can be used instead.

The present invention can be appropriately used in, e.g., a mounding device of an inspection apparatus.

While the invention has been shown and described with respect to the embodiments, it will be understood by those skilled in the art that various changes and modification may be made without departing from the scope of the invention as defined in the following claims.

What is claimed is:

1. A mounting device comprising:

a vertically movable mounting table for mounting thereon a target object; and a rotational driving mechanism for rotating the mounting table within a predetermined angle, wherein the mounting table is vertically raised and rotated by the rotational driving mechanism, and wherein the rotational driving mechanism includes: a driving shaft extending in a tangential direction of the mounting table; a moving body moving in the tangential direction via the driving shaft; a first cam follower attached in perpendicular to the moving body; a second cam follower extending horizontally from an outer circumferential surface of the mounting table so as to be in contact with the first cam follower; and a resilient member connecting the mounting table and the moving body so as to bring the first cam follower and the second cam follower into elastic contact with each other wherein a first attaching member is fixed to an outer circumferential surface of the mounting table along a circumferential direction thereof, wherein a horizontal bracket is formed at the first attaching member near the second cam follower and a first end of the resilient member is connected to a hole of the horizontal bracket.

2. The mounting device of claim 1, wherein the rotational driving mechanism has a rotation driving unit for rotating the driving shaft.

3. The mounting device of claim 1, wherein the rotational driving mechanism has a linear guide mechanism for moving and guiding the moving body in the tangential direction.

4. The mounting device of claim 2, wherein the rotational driving mechanism has a linear guide mechanism for moving and guiding the moving body in the tangential direction.

5. The mounting device of claim 1, wherein the resilient member is a spring.

6. The mounting device of claim 2, wherein the resilient member is a spring.

7. The mounting device of claim 3, wherein the resilient member is a spring.

8. The mounting device of claim 4, wherein the resilient member is a spring.

9. The mounting device of claim 1, wherein the second cam follower is guided by the first cam follower while the mounting table is vertically raised and the first cam follower is guided by the second cam follower while the mounting table is rotated.

10. The mounting device of claim 1, wherein the second cam follower is rotatable on a shaft extending horizontally from the outer circumferential surface of the mounting table.

11. The mounting device of claim 1, wherein a second end of the resilient member is connected to a third shaft which is provided at a base end of a supporting member of the moving body.

* * * * *